(12) United States Patent
Chan

(10) Patent No.: US 6,920,528 B1
(45) Date of Patent: *Jul. 19, 2005

(54) SMART MEMORY

(75) Inventor: Hugo W. K Chan, Fremont, CA (US)

(73) Assignee: Nanoamp Solutions, Inc, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/761,623

(22) Filed: Jan. 20, 2004

Related U.S. Application Data

(63) Continuation of application No. 09/898,520, filed on Jul. 2, 2001, now Pat. No. 6,681,287.

(51) Int. Cl.[7] .............................................. G06F 13/00
(52) U.S. Cl. ........................ 711/115; 711/104; 711/154; 711/167
(58) Field of Search ................................ 711/104, 115, 711/154, 167

(56) References Cited

U.S. PATENT DOCUMENTS

| | | | | |
|---|---|---|---|---|
| 5,600,844 A | * | 2/1997 | Shaw et al. | 715/500 |
| 5,706,290 A | * | 1/1998 | Shaw et al. | 370/465 |
| 6,178,476 B1 | * | 1/2001 | Powell | 710/305 |
| 6,256,945 B1 | * | 7/2001 | Yates et al. | 52/177 |
| 6,681,287 B2 | * | 1/2004 | Chan | 711/104 |

* cited by examiner

*Primary Examiner*—Reba I. Elmore
(74) *Attorney, Agent, or Firm*—Patrick T. King

(57) ABSTRACT

A smart memory includes a memory array and one or more memory-intensive additional functions, all packaged in a standard memory package that has substantially the same fit and form as a standard integrated-circuit memory. One type of smart memory chip is a multi-media RAM (MMRAM) chip that provides on a single integrated-circuit chip a memory array and a compressor/decompressor (CODEC) section where connections between the memory array section and the CODEC section are on the single integrated-circuit die. The smart memory eliminates the need for additional special function integrated-circuit packages and significantly reduces the clock rate and the power consumption of a baseband chip in a personal communication device.

20 Claims, 3 Drawing Sheets

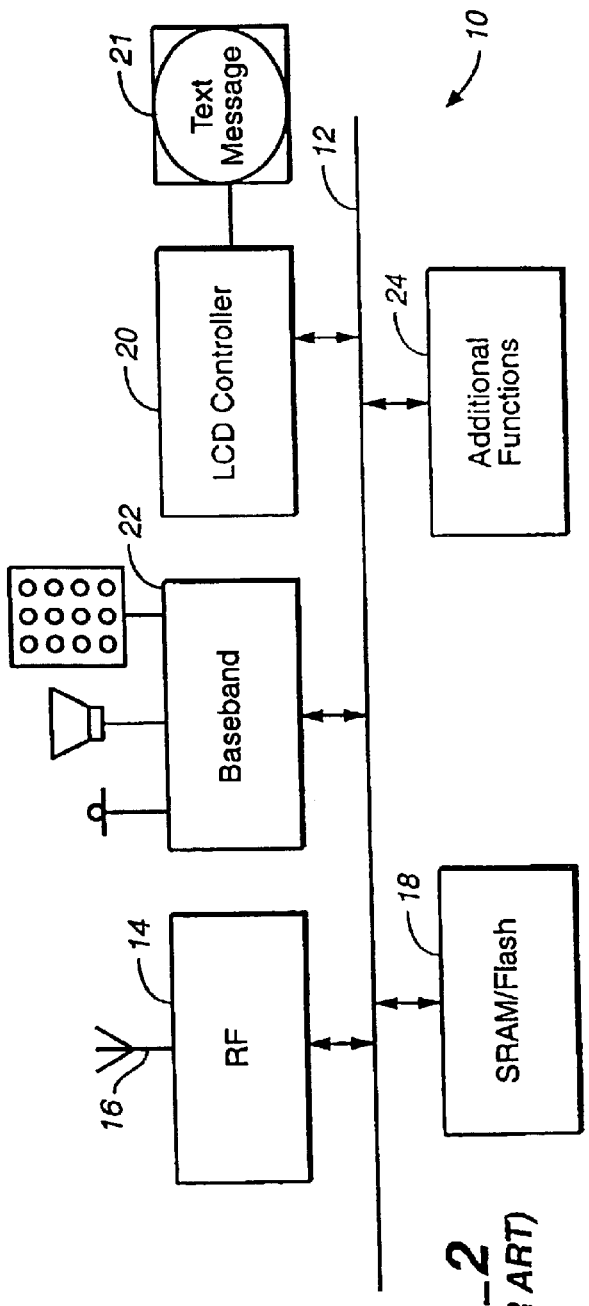
| Generation | 1G | 2G | 2.5G | 3G |
|---|---|---|---|---|
| Standard | AMPS, NMT, TACS | GSM, TDMA, CDMA ~ PDC | GPRS-EDGE | W-CDMA, CDMA2000, TD-SCDMA |
| Spectrum | 824-893 MHZ | 900, 1800, 1900 MHZ | 900,1800,1900 MHZ | 1885-2025 2110-2200 MHZ |
| Information | Analog Voice | Digital Voice | Digital (MDR) | Digital Multimedia |
| Timing | 1979-Now | 1992-Now | 2001 | 2001 |
| Feature | Voice Service | Voice and Data Service as Fax, SMS | Voice and Higher Data Speed | Higher Data Rate More Secure |
FIG._1 (PRIOR ART)
FIG._2 (PRIOR ART)

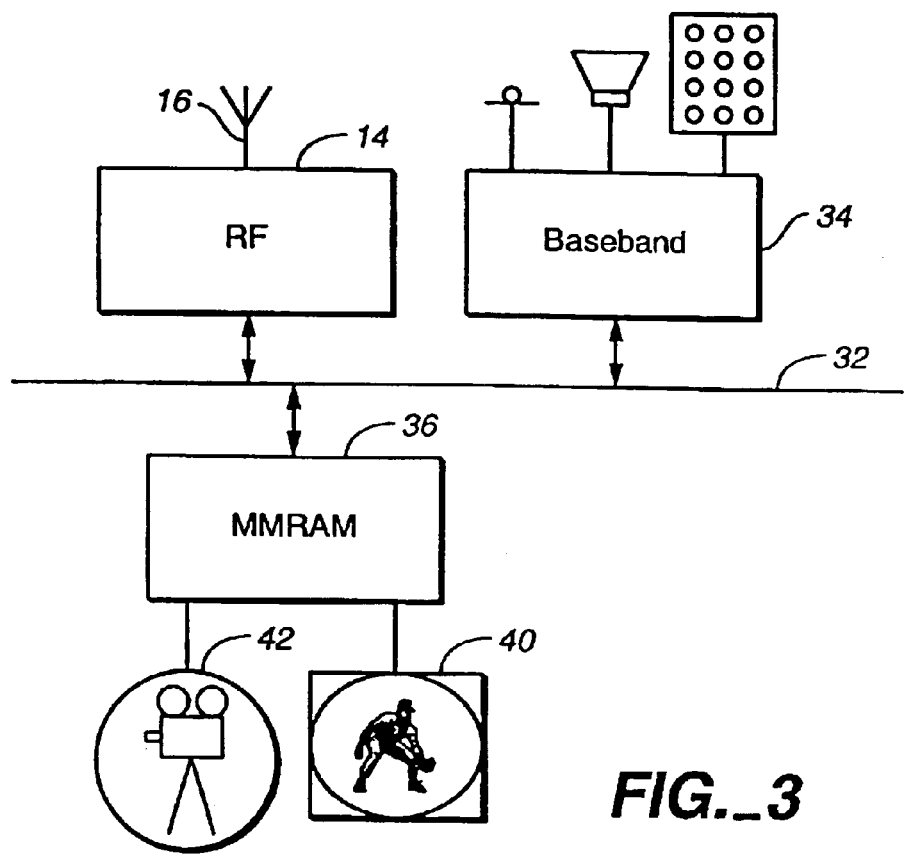
FIG._3

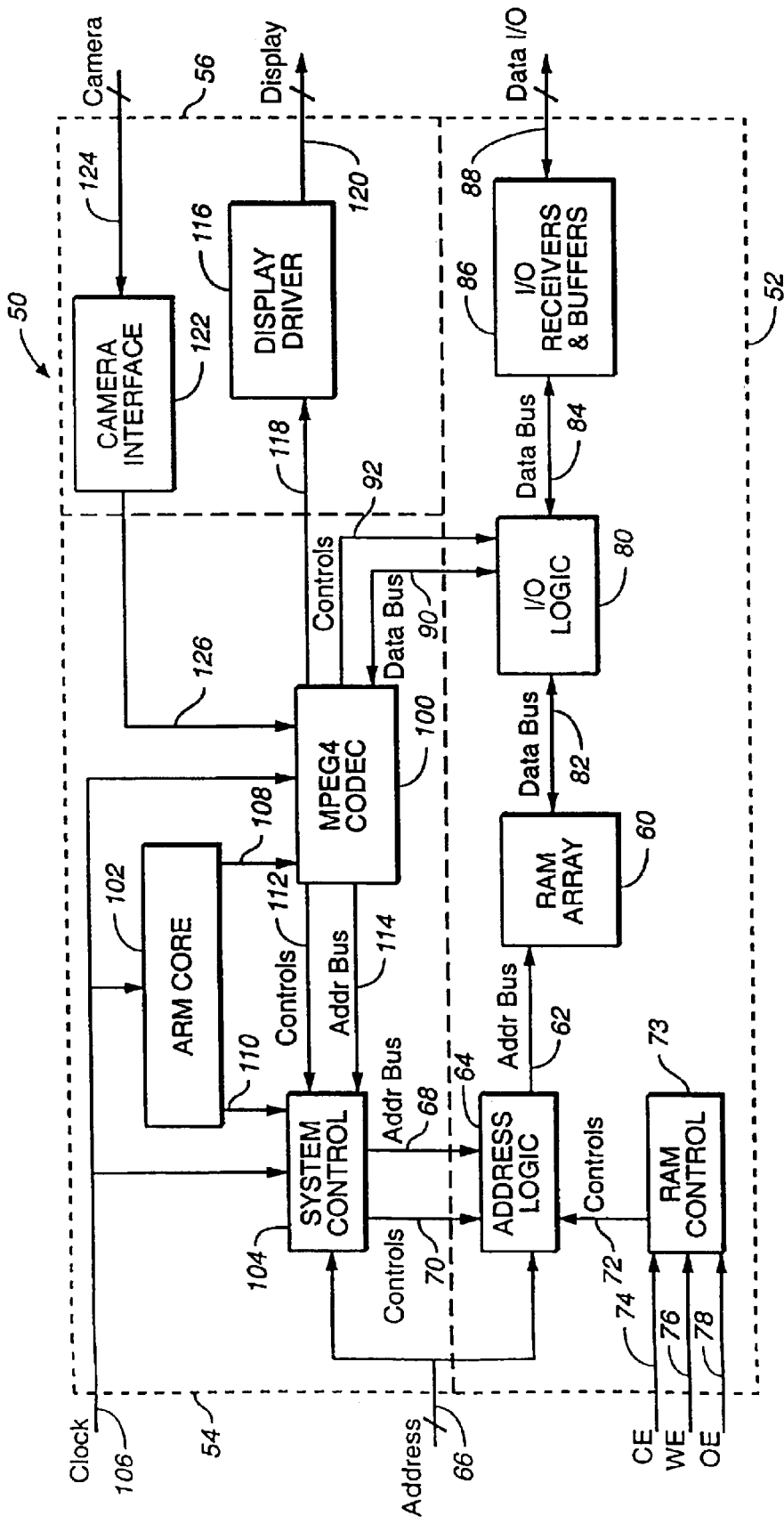
FIG._4

SMART MEMORY

This is a continuation of U.S. patent application Ser. No. 09/898,520 that was filed Jul. 2, 2001, now U.S. Pat. No. 6,681,287 and that is incorporated by reference herein.

BACKGROUND OF THE INVENTION

1. Field of the Invention

The present invention relates to integrated-circuit (IC) memory chips and, more particularly, to an enhanced integrated circuit memory chips that incorporate additional functions in a standard memory package.

2. Prior Art

Portable electronic devices such as laptop computers, cell phones, personnel digital assistants (PDA's), handheld or portable game consoles from companies such as Nintendo, Sony, and other portable electronic devices, all use standard integrated-circuit memories. Standard memories include, but are not limited to: static random access memory (SRAM), pseudo-SRAM, dynamic random access memory (DRAM), Flash memory, electronically erasable programmed read only memory (EEPROM), electronically programmed read only memory (EPROM), read-only memory (ROM), and others. These various types of standard memories are currently fabricated by a number of memory manufacturers such as, for example, Samsung, Sony, Mitsubishi, NEC, Micron, Infineon, Cypress, IDT, UMC, Hyundai, and others. Because standard memories are commodity products that are consumed in very large quantities, there are industry standards that define various physical aspects and electrical functions of various standard types of memory packages such as a small outline package (SOP), a thin small outline package (SOP), a shrink thin small outline package (STSOP), and a ball grid array (BGA) package. For packages with pins such as the various types of small outline packages (SOP), an industry standard includes the pin-layout configuration. For BGA packages, an industry standard includes the ball size, pitch, and layout.

An important aspect of memory products is that a successful memory product tends to become standardized in an industry. Industry standards are preferred by original equipment manufacture (OEM) manufacturers that are buyers of the standard memories and that prefer to have multiple suppliers supplying them with the same part so that the OEM manufacturers can have multiple sources for competitive pricing, scheduling, and other considerations. Standardization is also endorsed by memory manufacturers, especially for the later memory manufacturers that want to get into customer sockets for which there are already incumbent suppliers. To compete with the incumbent suppliers, the later memory manufacturers have to maintain the same basic fit, form, and function of a standard integrated-circuit memory package, or at least minimize the differences between their product and the standard. Fit of a memory package is the size of a memory integrated-circuit package in all three dimensions and the layout configuration of the memory integrated-circuit package. Form is the type of package and the package material, such as plastic or ceramic. Purchasing a component that conforms to an industry standard minimizes the work that a customer OEM manufacturer needs to do to accommodate using an integrated circuit from a later memory manufacturer. A memory integrated circuit of a later memory manufacturer typically performs the same memory functions as the memory integrated circuits of an incumbent supplier. The later memory integrated circuits often have improvements in speed, power consumption, and performance to make them more attractive than those of the incumbent suppliers.

Process technology for memory fabrication keeps improving so that memories double in density and size every few years. As an example, in the wireless communication industry, the memory requirements for a cell-phone handset have increased from a typical 1 Megabit SRAM together with an 8 Megabit Flash memory to a 2/4/8 Megabit SRAM together with 16/32/64 Megabits of Flash memory. The package fit and form for memory packages has evolved from a SRAM package and a separate Flash memory into a Flash/SRAM combination package that puts the SRAM and the Flash memory in the same package module, such as ball grid array (BGA). All BGA Flash/SRAM combinations have a similar typical package size, type, ball pitch, and layout, and are interchangeable with other manufacturers' products for particular customer uses, as previously discussed.

As cell phone designs have moved from a 2G second generation to a 3G third generation and beyond, memory requirements for the new cell-phone designs have further increased. In RAM designs, SRAMs are evolving into pseudo-static memories that have a DRAM core cell and a static RAM I/O interface. Eventually, as memory size and density further increase, SRAMS will evolve into pure DRAMs for cost reasons.

New wireless communication appliances, such as cell phones, PDAs, game consoles, and other portable devices require increased memory-array sizes. Concurrent with the requirement for increased memory-array size, a number of additional functions are being added to wireless telecommunication appliances as cell phone designs have gone from an analog to a digital format New cell phone designs now are provided with high-fidelity sound quality and with audio signal functions such as MP3 music, video, and other multimedia functions. Other additional capabilities that are being designed into wireless communication appliances include data streaming for accessing the internet, global positioning systems (GPS) for real-time map direction and locations, and Bluetooth appliances for short distance wireless communication between wireless communication appliances. Other additional capabilities are being introduced by IC suppliers and added to cell-phones and other wireless communication appliances.

The wireless communication industry has expanded rapidly in the 1990's. In 1999, the global sales of cell phones were about 280 million units. In 2000, the global sales of cell phones had grown to over 400 million units and are expected to approach 500 million units in 2001. With the explosion of the Internet, the global, internet-driven economy is motivating and enabling the burgeoning mobile data content and applications markets.

FIG. 1 is a chart that illustrates the evolution of various generations of mobile communication systems. The wireless-content business has evolved from primarily voice communication in the first 1G and the second 2G generations to digital in the 2.5 G generation. The third 3G digital multimedia generation provides multimedia wireless devices such as cell phones and wireless personal digital assistants (PDA's) such as Palms, and palmtop and laptop computers. These 3G multimedia wireless devices provide a high-resolution, color video display with quality comparable to a television (TV) set or to a personal computer (PC) monitor. To minimize the amount of data transfer required for these multimedia wireless devices, data compression and decompression (CODEC) techniques, such as Moving Picture Expert Group-4 (MPEG-4), are used extensively for streaming audio-visual information to provide applications such as content-based access for digital storage media, digital audiovisual communication, and other applications.

Companies have developed CODEC digital signal processor (DSP) chips that enable transmission and reception of high-quality audio and video signals over the Internet and through next-generation mobile handsets. These CODEC DSP chips use a quarter-common-intermediate format (QCIF) standard screen size of 176 by 144 pixels for video reproduction in videophones at a typical rate of 10–15 frames per second.

Typical wireless cell phone devices implement the CODEC DSP within the cell-phone baseband IC chip using an embedded controller/processor in conjunction with analog to digital (A-to-D) and digital to analog (D-to-A) converters.

In addition to CODECs, baseband (BB) IC suppliers are also incorporating one or more additional features such as Global Positioning Systems (GPS) and Bluetooth local wireless communication features into their baseband integrated circuits. To run all of these additional functions, more powerful processors from manufacturers such as ARM, Intel, and MIPs, etc., are required to run at high clock rate to meet the processing requirements for additional functions. Running more powerful processors at high data rates uses a lot of power, which can rapidly drain a battery and thereby reduce the active operation time of a mobile handset.

Furthermore, in order to access data stored in a handset integrated-circuit memory for data encoding/decoding, data compression/decompression, and display purposes, the baseband chip has to communicate with a memory chip every clock cycle on the printed-circuit data busses between the separate baseband integrated-circuit package and the memory integrated-circuit package. To effectively drive the printed-circuit board (PCB) data busses between the separate baseband integrated-circuit package and the separate memory integrated-circuit package at a high enough data rate, integrated-circuit output drivers on each integrated circuit have to provide sufficient current drive to the PCB data busses. This further increases power consumption and drains the battery.

FIG. 2 shows a simplified system architecture for a prior-art multimedia wireless system 10 that is used in a typical wireless communication device, such as a cell phone. The system typically includes several discrete integrated-circuit packages that communicate with each other through a bus on a printed-circuit board, represented as a PCB bus 12. A radio frequency (RF) integrated circuit 14 transmits and receives RF signals through an antenna 16. Data signals are sent to and from the RF integrated circuit 14 on the PCB bus 12. A standard memory integrated-circuit package 18, such as a SRAM or a Flash/SRAM combination memory, that has its terminals connected to the system bus 12. A liquid crystal display (LCD) controller integrated circuit 20 has its terminals connected to the system bus 12 and provides signals for displaying text on a suitable LCD-display device 21, such as a LCD text display screen. A baseband (BB) integrated circuit 22 is provided with a microcontroller core, such as provided by ARM or MIPs.

FIG. 2 illustrates that most of the additional functions required in a typical cell phone are typically provided by the baseband integrated circuit 22. Additional capability, such as, for example, MPEG4 capability, is provided as a soft-wired or hardwired function that is embedded in hardware and/or software of the baseband integrated circuit 22.

In the case where the base-band integrated circuit cannot accommodate the additional functions, one or more additional special function integrated circuit packages, illustratively represented as 24, are provided, such as, for example, a GPS integrated circuit chip package to provide desired additional functions. To provide even more special, dedicated functions, a baseband chip set is provided that conventionally includes a microcontroller and one or more additional DSP integrated circuits.

It can be appreciated that using additional integrated circuits of a baseband chip sets is not preferred by cell-phone handset manufacturers. Additional integrated circuits increase the size of a printed circuit in the cell-phone, increase the cell-phone weight, require more inventory and control of the additional integrated circuits, and add additional cost for the additional integrated circuits. For these reasons, as more advanced models are developed by the cell phone industry, the trend is to integrate as many functions as possible into a single multi-function base-band integrated circuit and to eliminate special-function integrated circuits or chip sets.

However, it should also be appreciated that the cell-phone industry trend toward adding more functions to a single baseband integrated circuit or to a baseband chip set increases the complexity of the base-band integrated circuit or chip set and requires additional signal processing power in the baseband integrated circuit. For example, the basic microcontroller unit used in the baseband chips has changed from an ARM 7 to 9 to an ARM 10 to 11, while the clock cycle rate has gone from tens of megahertz to a few hundred Megahertz These large increases in performance requirements for a single baseband integrated circuit or a baseband chip set have increased the size, number, complexity, and cost of baseband integrated circuits. It should also be appreciated that the power requirements for a more complex baseband integrated circuit have also increased. In future 3G and beyond cell-phone designs, the cellphone or wireless appliance will be required to be constantly on with the baseband integrated circuit being required to be constantly running at a very high clock rate. This will significantly increase the power consumption of the baseband integrated circuit and will rapidly drain a cell-phone battery, reducing the usable time between cell-phone battery charges.

Consequently, a need exists for a technique that adds additional memory-intensive functions into portable electronic devices, such as a wireless appliance or a cell phone, but that does not increase package count and power consumption while keeping substantially the same fit and form as a standard memory integrated circuit.

SUMMARY OF THE INVENTION

It is therefore an object of the invention to provide a technique that adds additional functions for mobile communication and consumer electronics into a wireless appliance, such as a cell phone. The technique does not significantly increase power consumption and provides additional functions while keeping substantially the same fit and form as a standard integrated-circuit memory.

The present invention provides a smart memory device that includes a memory array and that incorporates one or more memory-intensive additional functions. All of these are packaged in a standard memory package to relieve the workload on a baseband chip. By incorporating these additional memory-intensive functions with a standard memory package such as, for example, a Flash-SRAM combination package, a number of advantages are obtained. These advantages include: elimination of the need for additional special function integrated-circuit packages; significant reduction of functions preformed by the baseband chip, and reduction of the clock rate and the power consumption of the baseband chip.

One type of smart memory chip is a multi-media RAM (MMRAM) chip that provides on a single integrated-circuit chip a memory array and a compressor/decompressor (CODEC) section where connections between the memory array section and the CODEC section are on the single integrated-circuit die.

The smart memory and the multi-media RAM provides a single chip architecture that significantly reduces processing speed and power requirement of a baseband micro controller unit (MPU). The smart memory and the multi-media RAM fits the same package with similar or identical pins or ball bump layouts as a conventional memory with minimal or no changes of a PC board layout, for example, of a personal communication device. The special function, such as, for example, a MPEG4 function interacts internally with Flash/RAM memory with no external I/O buffer required. The present invention permits low-voltage, low-power data interactions that take place either on the same chip or between chips in the same package for memory-intensive functions, such as required for a MPEG4 system. The internal special function can be performed with an internal voltage supply level that is lower than an external voltage supply level that is required for external interfaces with other integrated-circuit packages.

The present invention provides a smart memory integrated-circuit device that includes a memory array section and a special-function section that is packaged with the memory array section in a single smart memory integrated-circuit package. This arrangement provides a single smart memory integrated-circuit package that incorporates all memory functions of a standard memory array section in addition to a special function that is provided by the special-function section in the single integrated-circuit package. This single smart memory integrated-circuit package has substantially the same type, fit, and form of a package for only a conventional memory package that has only the memory array without the special function section.

The special-function section is connected to the memory array section through a common internal bus within the smart memory integrated-circuit package. The invention is particularly useful for special functions that are memory-intensive functions, that is, functions that require a number of interactions with a memory array. Consequently, the present invention significantly reduces the need for the memory array section to communicate with another external, baseband integrated-circuit through an external common bus that has significantly greater propagation delay, parasitic capacitance, inductance, and resistance and that is required to be driven with higher current interface driving circuits.

The smart memory is used to replace a standard memory product in a wireless appliance and is also used to incorporate the special function section into a standard memory package. The smart memory thereby eliminates the need for an additional special function IC; the need to have a more powerful baseband chip; or the need to significantly alter wireless appliance hardware, software, system architecture, and a printed-circuit design to which the single package is mounted in the wireless appliance.

In one embodiment of the invention the memory array section and the special-function section are formed together monolithically as a single integrated-circuit chip. The memory array section and the special-function section are formed on a single integrated circuit with the same fabrication process. Alternatively, the memory array section and the special-function section are provided as separate integrated-circuit chips that are contained in the same smart-memory package. To save power, the special-function section operates on an internal voltage supply level that is lower than an external voltage supply level for the smart memory integrated-circuit package.

The special-function section for a smart memory includes a number of special functions. One group of special function includes a function selected from a group consisting of: a high-fidelity audio system, a multi-media codec, a wireless short-distance communication system, streaming video system, a wireless local area network (LAN), a Global Positioning System, and a video display. A number of memory array types are used including a memory array section that is selected from a group consisting of: a SRAM, a pseudo-SRAM, a DRAM, an EEPROM, an EPROM, a FLASH, a DRAM/FLASH combination, a ferroelectric RAM, and a magneto-RAM. In addition, a number of smart memory package types are used such as, for example, a ball grid array BGA package.

One type of smart memory is a multi-media RAM (MMRAM) that provides on a single integrated-circuit chip a memory array section formed on the single integrated-circuit die and contained in a multi-media RAM package. A compressor/decompressor (CODEC) section is integrally formed on the same single integrated-circuit die and contained in the same multi-media RAM package as the conventional memory array section. The CODEC section is formed with the same fabrication process as the memory array section and connections between the memory array section and the CODEC section are on the same single integrated-circuit die.

The CODEC of a multi-media RAM is provided as hardwired logic circuits on the single integrated-circuit die. Alternatively, the CODEC is provided by a digital signal processor on the single integrated-circuit die.

A multi-media RAM according to the invention is particularly useful in a wireless device that has a baseband DSP IC and wherein the single IC die is adapted to have minimal I/O interfacing with the baseband DSP IC in said device such that the processing data rate of the baseband DSP IC is thereby reduced.

The package for the a single-chip multi-media RAM according to the invention is substantially the same as the package for a conventional memory array.

A method is provided according to the invention for enhancing the capability of an integrated-circuit memory by packaging a memory array section together with a special-function section in a single smart-memory integrated-circuit package. The method includes incorporating in the single smart-memory integrated-circuit package all of the memory functions of a standard memory that are provided by the memory array section in addition to incorporating a special function that is provided by the special function section. Such a single smart-memory integrated-circuit package has a type, fit, and form of a conventional, standard memory package for the memory array section without the special-function section. The single smart-memory integrated circuit that is provided according to this method is adapted to replace a standard memory product in a wireless appliance. The single smart-memory integrated-circuit incorporates the special-function section in the smart-memory integrated-circuit package without requiring an additional special function IC, without the need to have a more powerful baseband chip, and without the need to significantly alter wireless appliance hardware, software, system architecture, and a printed-circuit design to which the single package is mounted in the wireless appliance.

The method provides for connecting the special-function section with the memory array section through a common internal bus within the smart-memory integrated-circuit package. This significantly reduces the need for the memory array section to communicate with an external, baseband integrated-circuit over a common external bus that has significant propagation delay, parasitic capacitance, inductance, and resistance that further necessitate high current interface driving circuits. The method forming the memory array section and the special-function section together as a single integrated-circuit chip using the same fabrication process. Alternatively, the method includes forming the memory array section and the special-function section as separate integrated-circuit chips that are packaged together in the single smart-memory integrated-circuit package.

The method provides for operating the special function section on an internal voltage supply level that is lower than an external voltage supply level for the smart-memory integrated-circuit package. The special-function section is selected from a group consisting of: a high-fidelity audio system, a multi-media codec, a wireless short-distance communication system, streaming video system, a wireless LAN, a Global Positioning System, and a video display. The memory array section is selected from a group consisting of: a SRAM, a pseudo-SRAM, a DRAM, an EEPROM, an EPROM, a FLASH, a DRAM/FLASH combination, a ferroelectric RAM, and a magneto-RAM.

BRIEF DESCRIPTION OF THE DRAWINGS

The accompanying drawings, which are incorporated in and form a part of this specification, illustrate embodiments of the invention and, together with the description, serve to explain the principles of the invention.

FIG. 1 is a chart illustrating the evolution of various generations of mobile communication system standards.

FIG. 2 is a block diagram illustrating a conventional system architecture for a conventional prior-art multimedia wireless system in which a memory-intensive MPEG4 function is embedded in hardware and software in a baseband chip and in which other additional memory-intensive functions are embedded in an additional chip or chip set.

FIG. 3 is a block diagram illustrating multimedia wireless system architecture according to the present invention, by which an additional memory-intensive function, such as a MPEG4 multimedia function, is embedded in hardware software within a single memory chip package.

FIG. 4 is a block diagram of the chip architecture for a multi-media integrated-circuit memory chip according to the present invention.

DETAILED DESCRIPTION OF THE PREFERRED EMBODIMENT

Reference is now made in detail to preferred embodiments of the invention, examples of which are illustrated in the accompanying drawings. While the invention is described in conjunction with these preferred embodiments, it will be understood that it is not intended to limit the invention to these embodiments. On the contrary, the invention is intended to cover alternatives, modifications and equivalents, which may be included within the spirit and scope of the invention as defined by the appended claims.

FIG. 3 shows a general system architecture according to the present invention for implementing a multimedia wireless system 30 that is used in a typical wireless communication device, such as a cell phone handset. In contrast to the conventional system of FIG. 2, the wireless communication system 30 includes integrated-circuit packages that communicate much less with each other through a system printed-circuit bus 32. There are some significant differences between the conventional system and a system according to the present invention. It will be seen that fewer separate integrated-circuit packages are required and that much less is demanded of the system bus 32 of FIG. 3 due to a significant and more efficient re-arrangement of memory-intensive functions in the integrated-circuit packages. This permits low-voltage, low-power data interactions that take place either on the same chip or between chips in the same package for memory-intensive functions, such as required for a MPEG4 system.

FIG. 3 illustrates a system 30 that has a printed-circuit bus 32 for providing appropriate signals between a simplified baseband (BB) integrated circuit 34 and a smart, multi-media memory MMRAM integrated circuit 36, according to the invention. The smart multi-media memory MMRAM integrated circuit 36 that is provided according to the invention combines in a single chip or package a memory array with a memory-intensive special function, such as an MPEG-4 CODEC.

A separate display-controller integrated circuit is not needed because a display controller circuit is also included in the multi-media memory MMRAM integrated circuit 36 to provide signals for a suitable display device such as a LCD screen 40. The multi-media memory MMRAM integrated circuit 36 also interfaces directly with a camera 42.

The baseband (BB) integrated circuit 34 is simplified because no additional memory-intensive functions, such as, for example, MPEG4, are required to be resident in the baseband (BB) integrated circuit 38. As required, the multi-media memory MMRAM integrated circuit 36 is provided with a ARM or MIPs microcontroller core.

The smart, multi-media memory MMRAM integrated circuit 36 provides a standard memory function in a package that has substantially the same footprint, form, and fit as a standard integrated-circuit memory package. In addition, the SMART MEMORY integrated-circuit package also simultaneously incorporates one or more memory-intensive functions in that same package. These memory-intensive functions provide, for example, soft-wired or hardwired compressor/decompressor (CODEC) functions, such as MPEG4, within the multi-media memory MMRAM integrated circuit 36. Putting memory intensive functions, such as CODECs, in the same chip as a memory array has distinct advantages over having the memory intensive functions being provided in the prior-art additional, separate baseband chips that must communicate at high signal levels on a bus between separate integrated-circuit packages. Cell phones and other wireless appliances use standard memories to handle a large volume of data including program codes and other codes that are stored within the cell phone.

By incorporating additional memory-intensive functions within a standard memory such as, for example, a Flash-SRAM combo, it is possible to eliminate the need to have additional separate special-function integrated circuits. It is then possible to reduce the functions preformed by the baseband chip and to reduce the clock rate and the power consumption of the baseband chip.

Even though the multi-media memory MMRAM integrated circuit 36 provides a MPEG4 multimedia function, the SMART MEMORY PACKAGE according to the invention is packaged in a standard memory package with embedded logic functions. The embedded logic functions are provided by either hardwired logic or by software that is configured with a DSP macro cell, with or without an on-chip microcontroller core.

The multi-media memory MMRAM integrated circuit 36 has a number of significant advantageous features. One significant advantageous feature of a multi-media memory MMRAM integrated circuit 36 according to the invention is that it performs all of the conventional functions of a standard memory package and uses the same package type, fit, and form of a standard memory package. As such, a multi-media memory MMRAM integrated circuit 36 is a substantially pin-for-pin compatible replacement for a standard memory package that is used in existing cell-phone-architecture PCB designs. Consequently, the multi-media memory MMRAM integrated circuit 36 can easily replace an existing standard memory package with only minor modifications of the existing baseband software and a minor change on the cell-phone PCB, if needed, to accommodate the special function. An existing cell phone design can use the multi-media memory MMRAM integrated circuit 36 almost immediately to incorporates the additional functions that have been incorporated into the multi-media memory MMRAM integrated circuit 36.

The additional functions built into the multi-media memory MMRAM integrated circuit 36 chip or package eliminates the need for a separate additional special-function integrated circuit In addition, a more powerful baseband chip is not required so that no changes are required in the baseband chip. To obtain the additional functions provided by the multi-media memory MMRAM integrated circuit 36, no additional chips are needed and a more powerful baseband chip is not needed. It is also important that the multi-media memory MMRAM integrated circuit 36 according to the invention provides for a significant reduction of the time for product development of a new product, where such product development is usually a few months to more than a year or two.

Another significant advantageous feature of a multi-media memory MMRAM integrated circuit 36 according to the invention is that it incorporates those functions that are memory intensive on the multi-media memory MMRAM integrated circuit 36 so that the workload required from the base band chip is reduced.

Instead of running the baseband chip at a very high clock rate to perform various memory intensive functions, the present invention allows the baseband chip to operate in more of a supervisory mode. In the supervisory mode, the baseband chip just designates the functions to be performed by the multi-media memory MMRAM integrated circuit 36. Those designated function can include a video coder function, display drivers, a GPS location function, or a Bluetooth datasteaming function, etc. After designating the functions to be performed by the multi-media memory MMRAM integrated circuit 36, the baseband chip then goes on to do other tasks. The multi-media memory MMRAM integrated circuit 36 then checks back with the baseband chip only if needed and/or when the task assigned to the multi-media memory MMRAM integrated circuit 36 is finished. By assigning memory-intensive functions to the multi-media memory MMRAM integrated circuit 36, the baseband-chip can run at a much lower clock rate and reduces its power consumption.

Incorporating memory intensive functions monolithically on the SMART MEMORY chip also provides that the multi-media memory MMRAM integrated circuit 36 has its own internal hardwired logic, microcontroller, and/or DSP functions. Without the need to go to outside of the multi-media memory MMRAM integrated circuit 36 chip for memory intensive functions, high current input/output interface drivers are not required because communication within a chip requires much less power than does driving another separate chip on a common bus through an external interface. Because the multi-media memory MMRAM integrated circuit 36 does data storage, retrieval, and decoding internally all within the same chip or package without having to drive another external chip, such as an external baseband chip, there is no need to have high current I/O drivers within the multi-media memory MMRAM integrated circuit 36. This significantly reduces the power consumption required for the combined memory retrieval and decoding functions.

Many integrated circuit designs use dual or multiple voltage VCC supplies. For example, a 3V supply is used for external inter-chip I/O communication with other chips, while a 1.5V internal power supply is for internal, intra-chip signal communication within a chip. A single, monolithic chip according to the present invention puts all of the memory-intensive functions internally within a single memory chip. In contrast, the traditional approach incorporates all new memory-intensive functions into a separate baseband chip. Using the baseband chip or additional chip sets for memory-intensive functions requires constant external interfacing between the memory chip and the baseband chip. With the memory-intensive functions internal to the SMART MEMORY integrated-circuit chip, the memory-intensive functions can now be operated with lower-voltage internal power supply voltages. For example, an internal voltage of 1.5V is used instead of an external voltage of 3V. This results in a four times reduction in chip power because power scales as the square of the voltage. It should be appreciated Internally communicating signals between a memory array and a memory-intensive function within a single SMART MEMORY integrated-circuit chip significantly reduces signal propagation delay and eliminates additional I/O parasitic capacitance and resistance loading.

The present invention provides for incorporation of memory-intensive functions, such as data compression/decompression CODEC functions like MPEG4, within the same memory integrated-circuit chip package that is currently used on all wireless handset devices. These memories include SRAMs, low power DRAMs, pseudo-static RAMs, and Flash/RAM combination IC's, typically in Ball Grid Array (BGA) packages.

A CODEC is implemented by digital signal processing (DSP) techniques or hardwired using logic gates. By doing the algorithms using hardwire logic within the SMART MEMORY integrated-circuit chip, the SMART MEMORY integrated-circuit chip offloads, or removes, the CODEC function from baseband (BB) IC. This significantly reduces the processing requirements of the baseband IC 38.

CODEC function implemented in hardwired logic can typically be incorporated in 100–300 thousand gates. This typically requires a small silicon chip as compared to the size of a chip needed for a typical memory in a telephone handset. A typical telephone handset memory ranges, for example, from 8–32 Megabits of SRAM. The memory-intensive CODEC can therefore be incorporated within the SMART MEMORY integrated-circuit chip without a significant increase of die size. The resulting SMART MEMORY integrated-circuit chip in a BGA package also provides the same pin configuration as an existing conventional memory using the same BGA pin layout.

For many applications, the ability to do the additional memory-intensive functions, such as a multi-media function in a cell phone, using the same package profile as a conventional memory pin package is a major advantage in terms of portability. For example, conventional memory in a general packet radio services (GPRS) phone can be replaced with a MMRAM package according to the invention that has the same density and pin-layout as used by a typical memory package in a cell phone. For a Flash-SRAM combo chip in a BGA (Ball Grid Array) package, the SMART MEMORY integrated-circuit package uses the same package and the same ball pitch and layout as a conventional memory. Any extra pin, such as a clock or interrupt type are added within the same ball/pin layout diagram. Doing a software modification on the existing baseband chip can significantly enhance the function of the cell phone, giving it a multimedia capability and making it attractive to both service providers and end customers. A product according to the invention services businesses in the instant video clips domain and enables video communication through wireless to other wireless devices such as personal digital assistant (PDA), laptops, smart video cameras, cell-phones and other devices. The video clips and/or internet video download features will be very popular as evidenced by the immense success of the SMS (short message service) offered in Europe and the IMODE offered by NTT DoCoMo. A MMRAM or SMART MEMORY integrated-circuit package according to the present invention enables a video-clip version of the SMS. Furthermore, because video clips are done with data packets and because service providers can support this type of service on a per message (vs. fixed time) basis, there will be a strong support by the service providers of such multi-media service.

Because the multi-media CODEC function is done within the memory chip instead of being done in a separate baseband chip, an integrated CODEC function is fully portable and can be used with a variety of different baseband chips (e.g. TI, Analog devices, Qualcomm, Infineon, etc.) with just software modification on the existing baseband ICs. The present invention provides portability between the designs of various equipment manufacturers of personal communication devices. The present invention provides the ability to add additional multimedia functions to a Smart Memory integrated-circuit package while reducing the power requirements a personal communication device simply replacing a conventional handset memory with a or a MMRAM-Flash combo plus minor/no modifications of the PC board/module. The invention provides a new class of special function memory packages that will provide a number of applications in new generations of multimedia wireless devices.

FIG. 4 illustrates an example of an architecture for a smart, multi-media integrated-circuit memory chip 50 according to the present invention. The multi-media integrated-circuit memory chip 50 includes a conventional memory section 52, a MPEG4 special-function section 54, and a video interface special-function section 56. The package for the chip 50 has substantially the same type, fit, and form of a package for only a conventional memory package that has only a memory array without the special function sections.

The memory section 52 includes a RAM array 60 that is provided with address signals on a an address bus 62 from an address logic circuit 64. The address logic circuit 64 receives external address signals from an address input signal bus 66. Internal address signals are received from an internal address bus 68. Internal control signals are received from an internal address control bus 70. Memory control signals are provided on a memory control bus 72 from a RAM control circuit 72 that receives a chip enable signal CE on a signal line 74, a write enable WE signal on a signal line 76, and an output enable OE signal on a signal line 78.

The memory section 52 also includes an I/O logic circuit 80 that sends and receives memory data from the RAM array 60 on an internal memory data bus. The I/O logic circuit 80 sends and receives data signals between the MPEG4 special-function section 54 on a data bus 90. Control signals for the I/O logic circuit 80 are received from the MPEG4 special-function section 54 on a control line 92.

The I/O logic circuit 80 sends and receives memory data on a data bus 84 connected to an I/O input receiver/output buffer circuit. External input and output data is received and sent on a data I/O bus 88.

The MPEG4 special-function section 54 includes a MPEG4 data compressor/decompressor CODEC circuit 100, a microcontroller core 102, and a system control circuit 104. A clock signal is provided to the MPEG4 data compressor/decompressor CODEC circuit 100, the microcontroller core 102, and the system control circuit 104 on a control line. The microcontroller core 102 provides control signals to the MPEG4 CODEC circuit 100 on a control line 108. The microcontroller core 102 also provides control signals to the system control circuit 104 on a control line 110. The MPEG4 CODEC circuit 100 provides control signals on a control line 112 to the system control circuit 104. The MPEG4 CODEC circuit 100 provides address signals on an address signal bus 114 to the system control circuit 104.

The video interface special-function section 56 includes a display driver circuit 116 that receives input signals from the MPEG4 CODEC circuit 100 on a signal bus 118. Output display signals from the MPEG4 CODEC circuit 100 are proved on a signal bus to an external display device, such as a LCD display.

The video interface special-function section 56 includes a camera interface circuit 122 that receives external camera signals on a bus 124. The camera interface circuit 122 provides output signals to the MPEG4 CODEC circuit 100 on a bus 126.

The foregoing descriptions of specific embodiments of the present invention have been presented for purposes of illustration and description They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A smart memory integrated-circuit device, comprising:
   a memory array section;
   a special-function section and special-function software used by the special-function section to provide a function other than an exclusive memory function, wherein the special-function section and special-function software are packaged with the memory array section in a single smart memory integrated-circuit package; and
   wherein said single smart memory integrated-circuit package incorporates all memory functions of a standard memory that are provided by the memory array section and special-function software in addition to a special function that is provided by the special-function section in the single integrated-circuit package; and wherein the special-function section that provides a function other than an exclusive memory function is connected to the memory array section through a common internal bus within the smart memory integrated-circuit package to thereby significantly reduce the need for the memory array section to communicate with another external, baseband integrated-circuit through an external common bus that has significantly greater propagation delay, parasitic capacitance, inductance, and resistance and that is required to be driven with higher current interface driving circuits.

2. The smart memory of claim 1 wherein the single smart memory integrated-circuit package has substantially the same type, fit, and form of a package for only a conventional memory package that has only the memory array without the special function section.

3. The smart memory of claim 1 wherein the special function section that provides a function other than an exclusive memory function provides one or more memory-intensive functions.

4. The smart memory of claim 1 wherein the smart memory integrated-circuit package is adapted to replace a standard memory product in a wireless appliance and is also adapted to incorporate the special function section into a standard memory package and thereby not requiring an additional special function IC; the need to have a more powerful baseband chip; or the need to significantly alter wireless appliance hardware, software, system architecture, and a printed-circuit design to which the single package is mounted in the wireless appliance.

5. The smart memory of claim 1 wherein the memory array section and the special-function section that provides a function other than an exclusive memory function are both formed together monolithically as a single integrated-circuit chip.

6. The smart memory of claim 1 wherein the memory array section and the special-function section that provides a function other than an exclusive memory function are both formed on a single integrated circuit with the same fabrication process.

7. The smart memory package of claim 1 wherein the memory array section and the special-function section that provides a function other than an exclusive memory function are provided as separate integrated-circuit chips that are both contained in the same smart-memory package.

8. The smart memory of claim 1 wherein the special-function section and the memory array section that provides a function other than an exclusive memory function operate on an internal voltage supply level that is lower than an external voltage supply level for the smart memory integrated-circuit package.

9. The smart memory of claim 1 wherein the special-function section that provides a function other than an exclusive memory function is selected from a group consisting of: a high-fidelity audio system, a multi-media codec, a wireless short-distance communication system, streaming video system, a wireless LAN, a Global Positioning System, and a video display.

10. The smart memory of claim 1 wherein the memory array section is selected from a group consisting of: a SRAM, a pseudo-SRAM, a DRAM, an EEPROM, an EPROM, a FLASH, a RAM/FLASH combination, a RAM/FLASH/ROM combination, a ferroelectric RAM, and a magneto-RAM.

11. The smart memory of claim 1 wherein the smart memory package type is selected from a group consisting of: a ball grid array BGA package, a quad flat pack QFP, a pin grid array package, and a multi-chip-module MCM package.

12. A smart memory integrated-circuit device, comprising:
a memory array section;
a special-function section that provides a function other than an exclusive memory function using software that is stored in the memory array section and that is packaged with the memory array section in a single smart memory integrated-circuit package;
wherein said single smart memory integrated-circuit package incorporates all memory functions of a standard memory that are provided by the memory array section in addition to a special function that is provided by the special-function section in the single integrated-circuit package;
wherein the special-function section is connected to the memory array section through a common internal bus within the smart memory integrated-circuit package; and
wherein the single smart memory integrated-circuit package has substantially the same type, fit, and form of a package for only a conventional memory package that has only the memory array section without the special function section.

13. A multi-media RAM (MMRAM) on a single integrated-circuit chip, comprising:
a memory array section that is formed on a single integrated-circuit die and that is contained in a multi-media RAM package;
a compressor/decompressor (CODEC) section integrally formed on the same single integrated-circuit die and contained in the same multi-media RAM package as the memory array section, said CODEC section formed on the same single integrated-circuit die with the same fabrication process as the memory array section;
wherein the CODEC section is provided with a digital signal processor and CODEC software on the single integrated circuit die;
wherein connections between the memory array section and the CODEC section are provided on the single integrated-circuit die.

14. The multi-media RAM of claim 13 wherein the single integrated-circuit die is adapted for use in a wireless device that has a baseband DSP IC and wherein the single IC die is adapted to have minimal I/O interfacing with the baseband DSP IC in said wireless device such that the processing data rate of the baseband DSP IC is thereby reduced.

15. The multi-media RAM of claim 13 wherein the CODEC is provided as a digital signal processor having a microcontroller and CODEC software on the single integrated-circuit chip.

16. The multi-media RAM of claim 13 wherein the package for the single integrated-circuit chip is substantially the same as the package for a conventional memory array formed on the single integrated-circuit die.

17. The multi-media RAM of claim 13, wherein the multi-media RAM package incorporates the CODEC section and the CODEC software into a standard memory package that is adapted to replace a standard memory product in a wireless appliance and thereby does not require an additional special function IC; a more powerful baseband chip; or significant alterations to the wireless appliance hardware, software, system architecture, and printed-circuit design to which the single package is mounted in the wireless appliance.

18. The multi-media RAM of claim 13 wherein the memory array section and the CODEC section are formed together monolithically as a single integrated circuit chip.

19. A method of enhancing the capability of an integrated-circuit memory, comprising:

packaging a memory array section together with a special-function section that provides a function other than an exclusive memory function in a single smart-memory integrated-circuit package; and incorporating in the single smart-memory integrated-circuit package all of the memory functions of a standard memory that are provided by the memory array section in addition to incorporating special-function software for the special function section; and connecting the special-function section with the memory array section through a common internal bus within the smart-memory integrated-circuit package to significantly reduce the need for the memory array section to communicate with an external, baseband integrated-circuit over a common external bus that has significant propagation delay, parasitic capacitance, inductance, and resistance that further necessitate high current interface driving circuits;

whereby the single smart-memory integrated-circuit package is adapted to replace a standard memory product in a wireless appliance and to incorporate the special-function section in the smart-memory integrated-circuit package without requiring an additional special function IC, without the need to have a more powerful baseband chip, or without the need to significantly alter wireless appliance hardware, software, system architecture, and a printed-circuit design to which the single package is mounted in the wireless appliance.

20. The method of claim 19 including packaging the memory array section and the special-function section that provides a function other than an exclusive memory function in a single smart-memory integrated-circuit package that has a type, fit, and form of a conventional, standard memory package for the memory array section without the special-function section.

* * * * *